(12) United States Patent
Lo et al.

(10) Patent No.: US 8,141,023 B2
(45) Date of Patent: Mar. 20, 2012

(54) METHOD AND APPARATUS FOR PREVENTING CONGESTIVE PLACEMENT

(75) Inventors: Chen-Hsing Lo, Hsinchu Hsien (TW); Chien-Pang Lu, Hsinchu Hsien (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 326 days.

(21) Appl. No.: 12/501,823

(22) Filed: Jul. 13, 2009

(65) Prior Publication Data

US 2010/0242009 A1 Sep. 23, 2010

(30) Foreign Application Priority Data

Mar. 19, 2009 (TW) ................................ 98108893 A

(51) Int. Cl.
*G06F 17/50* (2006.01)

(52) U.S. Cl. ........ 716/122; 716/129; 716/130; 716/131; 716/104

(58) Field of Classification Search .................. 716/122, 716/129, 130, 132, 104
See application file for complete search history.

(56) References Cited

U.S. PATENT DOCUMENTS

| 6,510,542 | B1 * | 1/2003 | Kojima | 716/114 |
| 7,197,732 | B2 * | 3/2007 | Murgai | 716/114 |
| 7,448,007 | B2 * | 11/2008 | Alpert et al. | 716/114 |
| 2006/0129960 | A1 * | 6/2006 | Murgai | 716/6 |

FOREIGN PATENT DOCUMENTS

| JP | 2000231583 A | * | 8/2000 |
| WO | WO 0079441 A2 | * | 12/2000 |

* cited by examiner

*Primary Examiner* — Phallaka Kik

(74) *Attorney, Agent, or Firm* — Edell, Shapiro & Finnan, LLC

(57) ABSTRACT

A congestive placement preventing apparatus, applied in a logic circuit layout having $2^K$ logic circuits, where K is a positive integer, is provided. The congestive placement preventing apparatus includes a restructuring module and a synthesizing module. The restructuring module adds a selecting unit in the logic circuit layout, and adds (N−K) buffers in each of the $2^K$ logic circuits, where N is a positive integer. The synthesizing module synthesizes the restructured logic circuit layout according to a plurality of "don't touch" synthesizing commands associated with the added buffers. In the synthesized logic circuit layout, all of the $2^K$ logic circuits are independent and not coupled or merged with one another.

20 Claims, 10 Drawing Sheets

```
module streamdvc1rom2 (HCLK,
  HRESETn, rom_cen
  input   HCLK; // Master clock
input  HRESETn ; // active low reset
input  rom_cen ; // active High
  input  [14:0] l2_rom_ad; // address
  output  [11:0] l2_rom_da;

always @(l2_rom_ad)
  begin : rom_proc
   case (l2_rom_ad)
    15'b 000000000000000,
       begin
          romdata  = 12'b 101000001000;
        end
   ...
endmodule
```

FIG. 4A Prior art

```
module streamdvc1rom2 (HCLK,
  HRESETn, rom_cen , l2_rom_ad, l2_rom_da);
  input   HCLK; // Master clock
 input  HRESETn ; // active low reset
 input  rom_cen ; // active High
  input  [14:0] l2_rom_ad; // address
  output  [11:0] l2_rom_da;
  wire [9:0] l2_rom_ad_buf0_;
  BUFX4   AD_BUF_DONT_TOUCH_0_0 (.A(l2_rom_ad[0] ), .Y(l2_rom_ad_buf0_[0]) );
 ...
  BUFX4   AD_BUF_DONT_TOUCH_0_9 (.A(l2_rom_ad[9] ), .Y(l2_rom_ad_buf0_[9]) );
  wire [9:0] l2_rom_ad_buf1_;
...
 always @(l2_rom_ad[9:0])
  begin : rom_proc_0
   case (l2_rom_ad_buf0_[9:0])
   10'b 0000000000 :
    begin
        romdata_0 = 12'b 101000001000;
 ... .
 endmodule
```

FIG. 4B

```
...
  set_dont_touch [find cell   AD_BUF_DONT_TOUCH *] true
...
```

FIG. 4C

METHOD AND APPARATUS FOR PREVENTING CONGESTIVE PLACEMENT

CROSS REFERENCE TO RELATED PATENT APPLICATION

This patent application is based on Taiwan, R.O.C. patent application No. 098108893 filed on Mar. 19, 2009.

FIELD OF THE INVENTION

The present invention relates to a logic circuit layout, and more particularly, to a congestive placement preventing method and apparatus applied to a register transfer level (RTL) hardware description language (HDL) of a logic circuit layout, so as to prevent from forming congestive regions that cannot be routed in the logic circuit layout.

BACKGROUND OF THE INVENTION

Accompanied with continual development of electronic technology, various electronic products are becoming more and more compact and versatile with overwhelmingly diversified functions. Therefore, a large number of electronic devices of all types need be provided in a chip having a relatively small area in order to meet actual requirements of the electronic products.

However, in certain circuit layouts, it happens that the number of electronic devices within a given area becomes too large. That is, a density of the electronic devices in the area is too high, such that routing between the electronic devices within the area becomes infeasible. The circuit layout may not only fail to pass design rule checking, but the circuit itself may be unable to function normally.

FIG. 1 shows a conventional logic circuit layout in a gate level HDL. For example, a logic circuit layout 1 comprises a plurality of devices, with a large logic cone formed as a synthesized result from synthesis.

In order to enable the logic circuit layout 1 to pass time constraints as well as reducing a utilization area thereof, all electronic devices in the logic circuit layout 1 are coupled to or merged with one another, or simplified. Consequently, complex connections are developed between a synthesized logic circuit layout, thus forming the large logic cone shown in FIG. 1.

The logic circuit layout 1, after the synthesis procedure, undergoes automatic placement-and-routing (APR) to form the logic circuit layout 1 comprising combinational logic devices c (e.g., NAND and OR logic gates) and sequential logic devices s (e.g., flip-flops), as shown in FIG. 2. With reference to FIG. 2, it is observed that, quite a number of combinational logic devices c are crowded at a congestive area 20 resulting in heavy congestion due to a high density of the combinational logic devices c. Such high density of electronic devices adds complications to routings between the electronic devices whereby the logic circuit layout 1 may fail to pass design rule checking.

Therefore, it is an objective of the invention to provide a method and apparatus for preventing congestive placement in circuit layout.

SUMMARY OF THE INVENTION

The invention provides an apparatus for preventing congestive placement applied to a logic circuit layout. The logic circuit layout comprises (N−K) first input ends, K second input ends, $2^K$ logic circuits, and M output ends; where M and N are integers greater than 1, and K is a positive integer.

According to the invention, the apparatus for preventing congestive placement comprises a restructuring module and a synthesizing module, both of which are coupled to the logic circuit layout. The restructuring module, for restructuring the logic circuit layout into a restructure logic circuit layout, adds a selecting unit into the logic circuit layout and (N−K) buffers to each of the $2^K$ logic circuits. Accordingly, in the restructured logic circuit layout, the selecting module is coupled to the K second input ends, the $2^K$ logic circuits, and M output ends; and the (N−K) buffers are coupled to the (N−K) first input ends.

According to the invention, the synthesizing module synthesizes the restructured logic circuit layout to a synthesized logic circuit layout according to a plurality of "don't touch" synthesis commands associated with the added buffers. It is to be noted that in the synthesized logic circuit layout, each of the $2^K$ logic circuits is independent, and is not coupled to or merged with one another, or simplified; that is, no connections exist between the logic circuits.

The invention further provides a method of preventing congestive placement applied to a logic circuit layout. The logic circuit layout comprises (N−K) first input ends, K second input ends, $2^K$ logic circuits, and M output ends; where M and N are integers greater than 1, and K is a positive integer.

According to the invention, the method comprises steps of: checking a hierarchy configuration of the logic circuit layout; adding (N−K) buffers to each of the $2^K$ logic circuits, wherein the (N−K) buffers access data according to (N−K) access signals inputted at the (N−K) first input ends among the N input ends to generate M data signals; adding a selecting unit to the logic circuit layout, wherein the selecting unit selects a corresponding logic circuit from the $2^K$ logic circuits according to K selection signals inputted at the K second input ends among the N input ends, and outputting the M data signal to the M output ends; and synthesizing the logic circuit layout according to a plurality of "don't touch" synthesis commands associated with the added buffers.

It is to be noted that, in the synthesized logic circuit layout, each of the $2^K$ logic circuits is independent, and is not coupled to or merged with one another, or simplified; that is, no connections exist between the logic circuits.

According to the method and apparatus of preventing congestive placement of the invention, buffers and a selecting unit are added to an RTL HDL to change an original logic circuit layout. Further, the logic circuit layout is synthesized according to a plurality of "don't touch" synthesis commands associated with the added buffers to ensure that each of the logic circuits in the circuit layout is kept independent without having any connections between one another.

Accordingly, in an APR result obtained after an APR procedure performed on the synthesized logic circuit layout, congestive regions where routing is infeasible are reduced.

BRIEF DESCRIPTION OF THE DRAWINGS

The present invention will become more readily apparent to those ordinarily skilled in the art after reviewing the following detailed description and accompanying drawings, in which:

FIG. 4A is an example of an RTL code of a common register;

FIG. 4B is an example of a modified RTL code of a register, with K=5;

FIG. 4C is an example of a modified synthesis code including a plurality of "don't touch" synthesis commands associated with the added buffers;

DETAILED DESCRIPTION OF THE PREFERRED EMBODIMENT

It is an objective of the invention to provide an apparatus and a method of preventing congestive placement. By implementing the apparatus and method of preventing congestive placement according to the invention, each logic circuit in the logic circuit layout is kept independent, and is not coupled to or merged with one another, or simplified. Therefore, it is ensured that, in an APR result from the synthesized logic circuit layout, congestive regions in the logic circuit layout are reduced, so that the logic circuit layout is able to pass design rule checking such as time constraints.

According to a first embodiment of the invention, an apparatus of preventing congestive placement applied to a logic circuit layout is provided. The logic circuit layout comprises (N−K) first input ends, K second input ends, $2^K$ logic circuits, and M output ends; where M and N are integers greater than 1, and K is a positive integer. For example, the logic circuit layout may include a look-up table for applying to a read-only memory (ROM).

Figure 1:
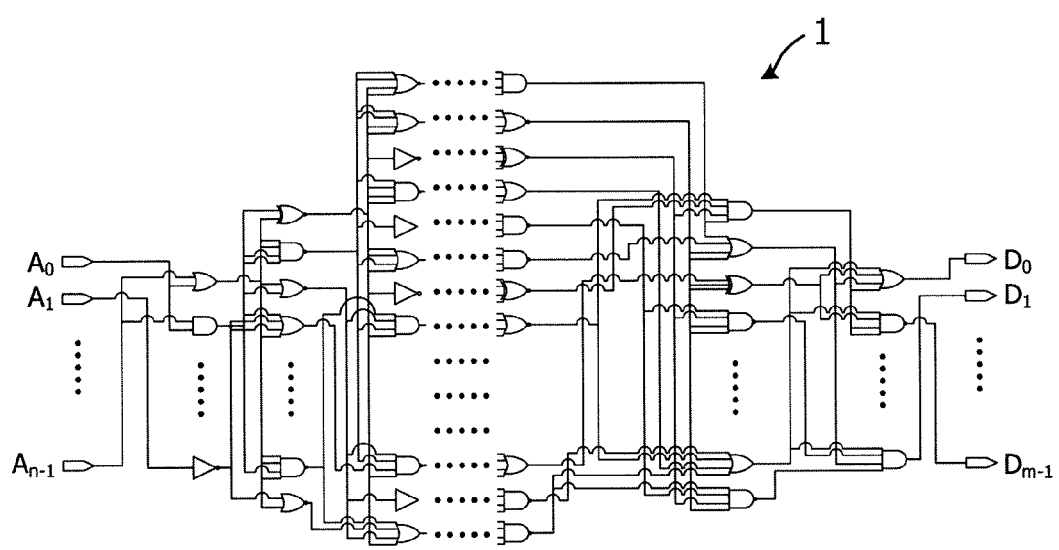
FIG. 1 is a schematic diagram of a conventional gate level Hardware Description Language (HDL) of a logic circuit layout.
Figure 2:
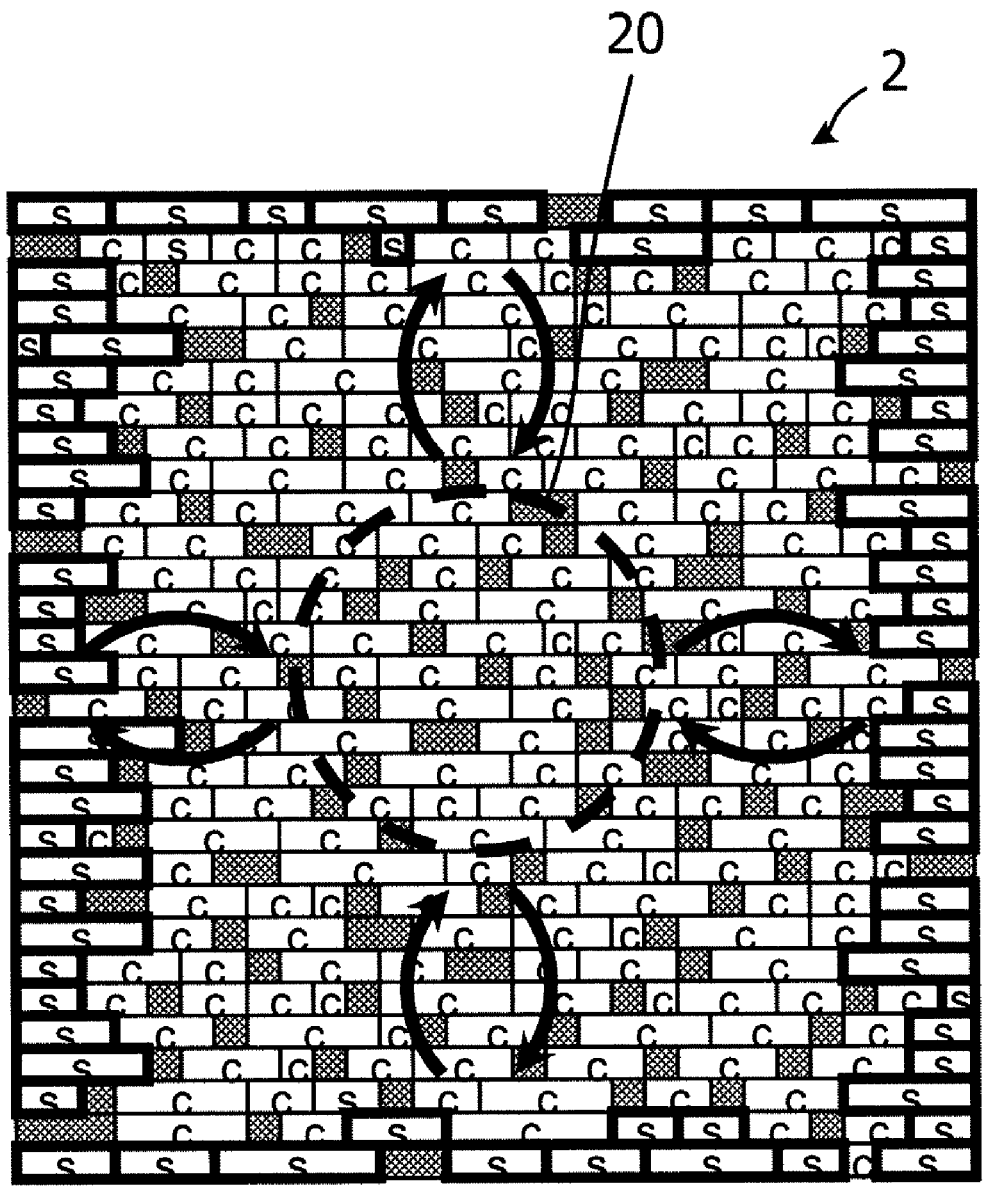
FIG. 2 is a schematic diagram of an APR result of the logic circuit layout in FIG. 1.
Figure 3A:
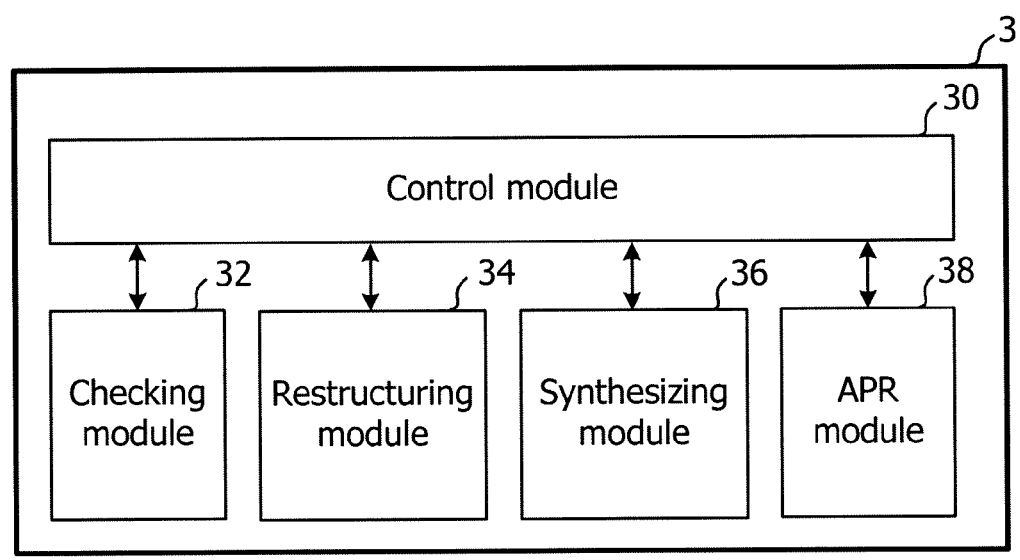
FIG. 3A is a functional block diagram of an apparatus for preventing congestive placement according to a first embodiment of the invention.

FIG. 3A shows a functional block diagram of an apparatus of preventing congestive placement. As shown in FIG. 3A, a congestive placement preventing apparatus 3 comprises a control module 30, a checking module 32, a restructuring module 34, a synthesizing module 36 and an automatic-placement-and-routing (APR) module 38. The control module 30 is coupled to the checking module 32, the restructuring module 34, the synthesizing module 36 and the APR module 38. The various modules of the congestive placement preventing apparatus 3 shall be discussed in detail below.

In this embodiment, the control module 30 of the congestive placement preventing apparatus 3 is for transmitting commands to the checking module 32, the restructuring module 34, the synthesizing module 36 and the APR module 38 to perform different operations on the logic circuit layout.

Upon receiving a checking command from the control module 30, the checking module 32 checks a hierarchy configuration of the logic circuit layout and reports a check result to the control module 30.

When the control module 30 decides to restructure based on the check result from the checking module, the control module 30 generates a restructuring command and transmits the restructuring command to the restructuring module 34. Upon receiving the restructuring command, the restructuring module 34 adds a selecting unit to the logic circuit layout, such that the selecting unit is coupled to the K second input ends, the $2^K$ logic circuits, and the M output ends. For example, the selecting unit may be a multiplexer.

Apart from adding the selecting unit, the restructuring module 34 also adds (N−K) buffers to each logic circuit of the $2^K$ logic circuits, with the (N−K) buffers coupling to the (N−K) first input ends. Note that in this embodiment, a value of (N−K) is smaller or equal to 12; however, this is not meant to limit the invention.

Figure 3B:
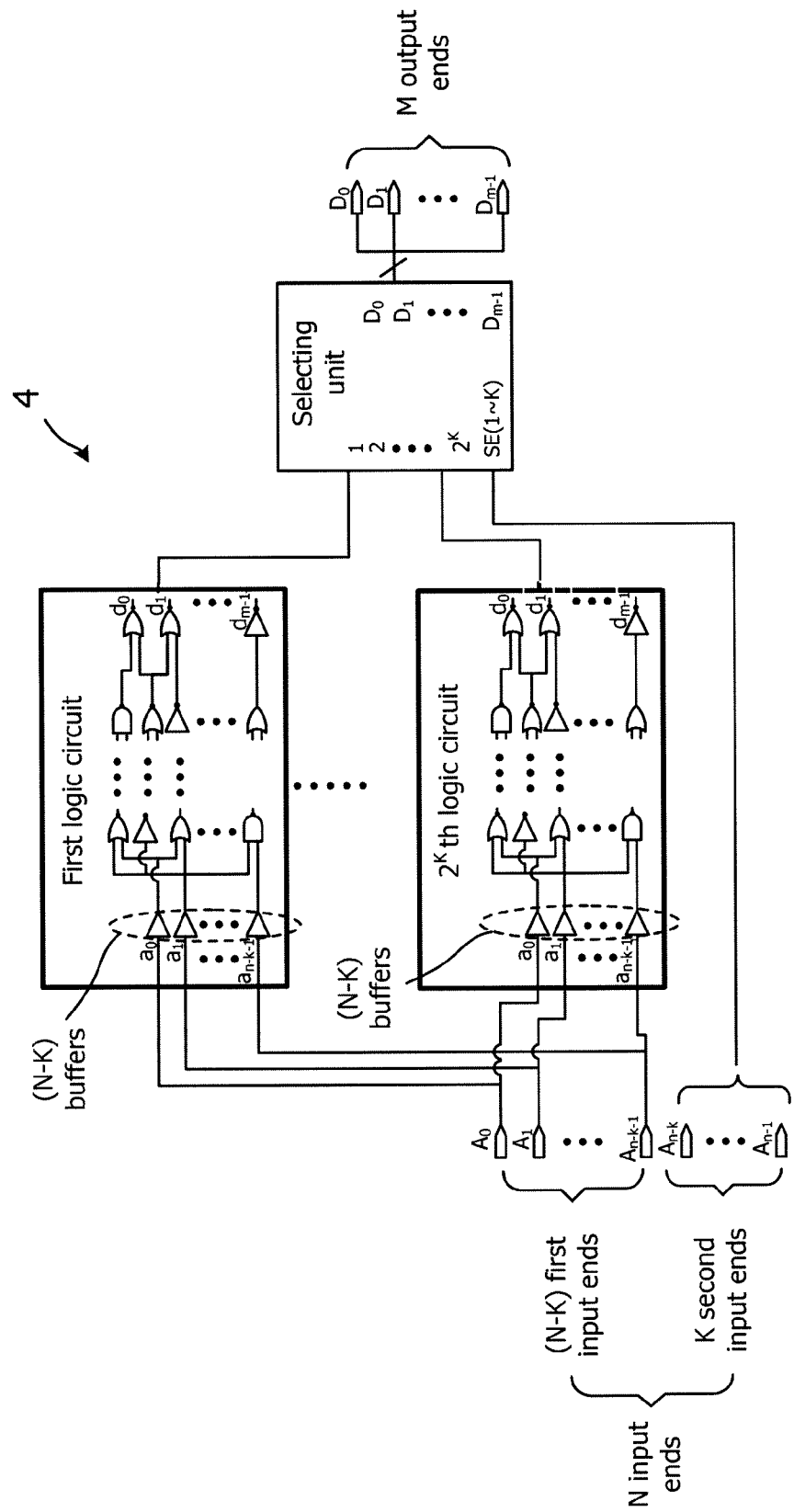
FIG. 3B is a schematic diagram of a gate level HDL of a logic circuit layout implementing the apparatus for preventing congestive placement of the invention.

Upon receiving a synthesis command from the control module 30, the synthesizing module 36 synthesizes and restructures the logic circuit layout from an original RTL HDL to a gate level HDL according to the synthesis command. FIG. 3B shows a schematic diagram of the synthesized logic circuit layout 4 in the gate level HDL.

As shown in FIG. 3B, in the synthesized logic circuit layout 4, each logic circuit accesses data according to (N−K) access signals inputted at the (N−K) first input ends to generate M data signals. The selecting unit selects a corresponding logic circuit from the $2^K$ logic circuits according to K selection signals inputted at the K second input ends among the N input ends, and outputs the M data signal to the M output ends.

It is to be noted that, the synthesis command is not a conventional synthesis command but is a modified "don't touch" synthesis command. FIG. 4A shows an example of a common RTL code of a register; FIG. 4B shows an example of a modified RTL code of a register, where K=5; and FIG. 4C shows a modified "don't touch" RTL code. Bold letters in FIGS. 4B and 4C indicate a code that is added as the modification to command in increasing the number of buffers and to add the "don't touch" commands associated with the added buffers. In practice, a description of the modified code may have other variations other than as illustrated in FIGS. 4A and 4B.

Figure 5:
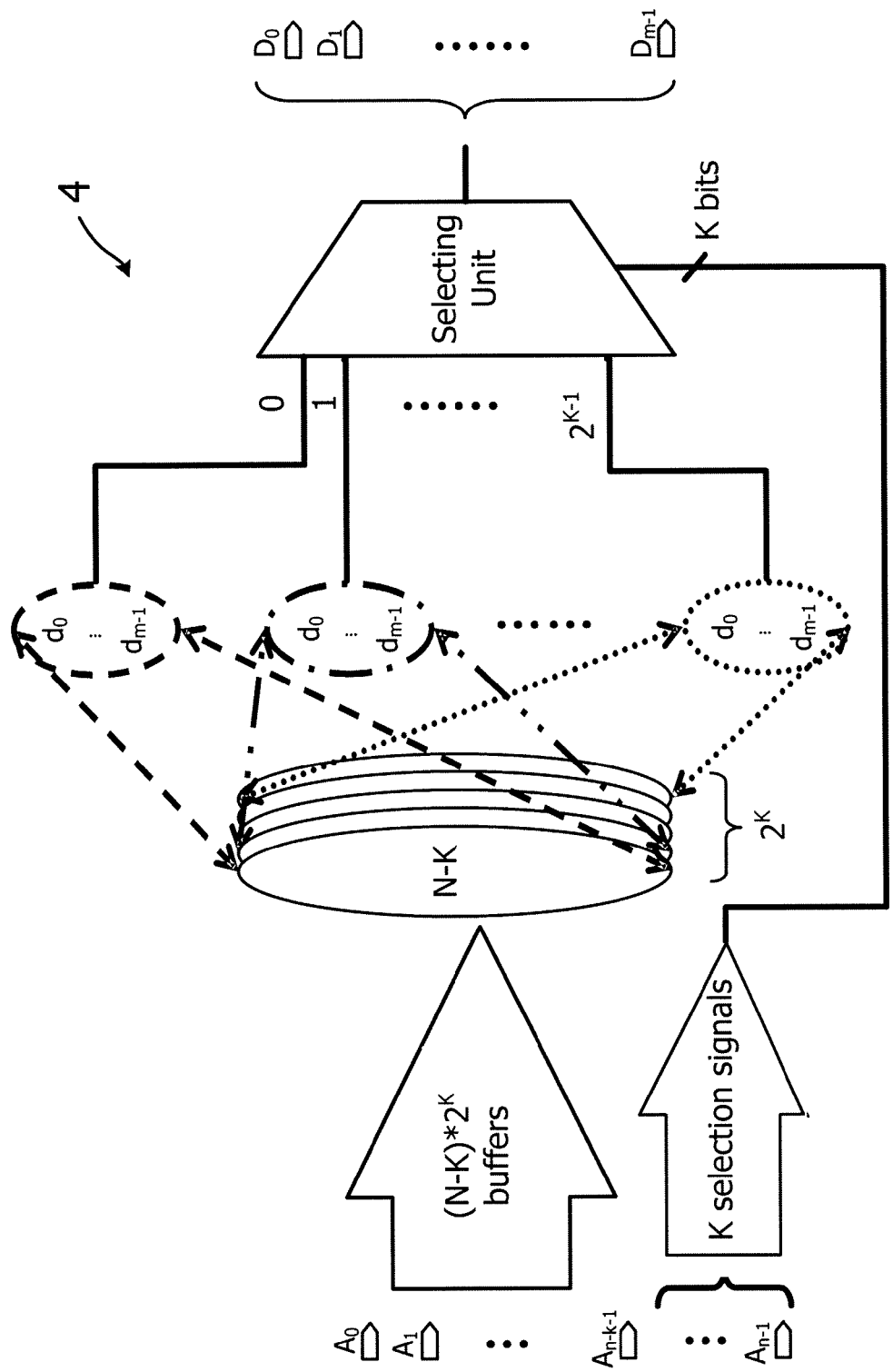
FIG. 5 is a schematic diagram of operations of a synthesized logic circuit layout in FIG. 3B.

FIG. 5 shows a schematic diagram of operations of the synthesized logic circuit layout 4 in FIG. 3B. As shown in FIG. 4, in the logic circuit layout 4, N input ends $A_0 \sim A_{n-1}$ include (N−K) first input ends $A_0 \sim A_{n-k-1}$ and K second input ends $A_{n-k} \sim A_{n-1}$, where N is an integer greater than 1 and K is a positive integer. Since each of the $2^K$ logic circuits is coupled to the (N−K) buffers coupled to the (N−K) first input ends $A_0 \sim A_{n-k-1}$, the logic circuit layout 4 comprises a total number of $(N-K)*2^K$ of buffers. Each logic circuit is able to access data according to access signals received at the (N−K) first input ends via the (N−K) buffers, and generate M data signals according to the access signals.

In the logic circuit layout 4, each of the $2^K$ logic circuits comprises M logic circuit output ends $d_0 \sim d_{m-1}$, and each of the M logic circuit output ends $d_0 \sim d_{m-1}$ is coupled to a selecting unit that is coupled to the K second input ends $A_{n-k} \sim A_{n-1}$. Therefore, according to selection signals inputted at the K second input ends $A_{n-k} \sim A_{n-1}$, the selecting unit selects a corresponding logic circuit from the $2^K$ logic circuits, and receives data signals outputted from the M logic circuits output ends $d_0 \sim d_{m-1}$. The selecting unit then transmits the data signals to M output ends $D_0 \sim D_{m-1}$ of the logic circuit layout 4.

In this embodiment, the number (N−K) is less than or equal to 12; that is, the number of the first input ends of the logic circuit layout 4 is limited to less than or equal to 12. For example, supposing the total number N of the input ends of the logic circuit layout 4 is 15 and the number of the number (N−K) of the first input ends is 10, the number K of the second input ends is consequently 5. More specifically, the selecting unit is for receiving selection signals inputted at the 5 second input ends. However, supposing the total number N of the input ends is 25 and the number (N−K) of the first input ends is 10, the number K of the second input ends is consequently 15; that is, the selecting unit shall be overloaded by having to receive selection signals inputted at the 15 second input ends.

Figure 6:
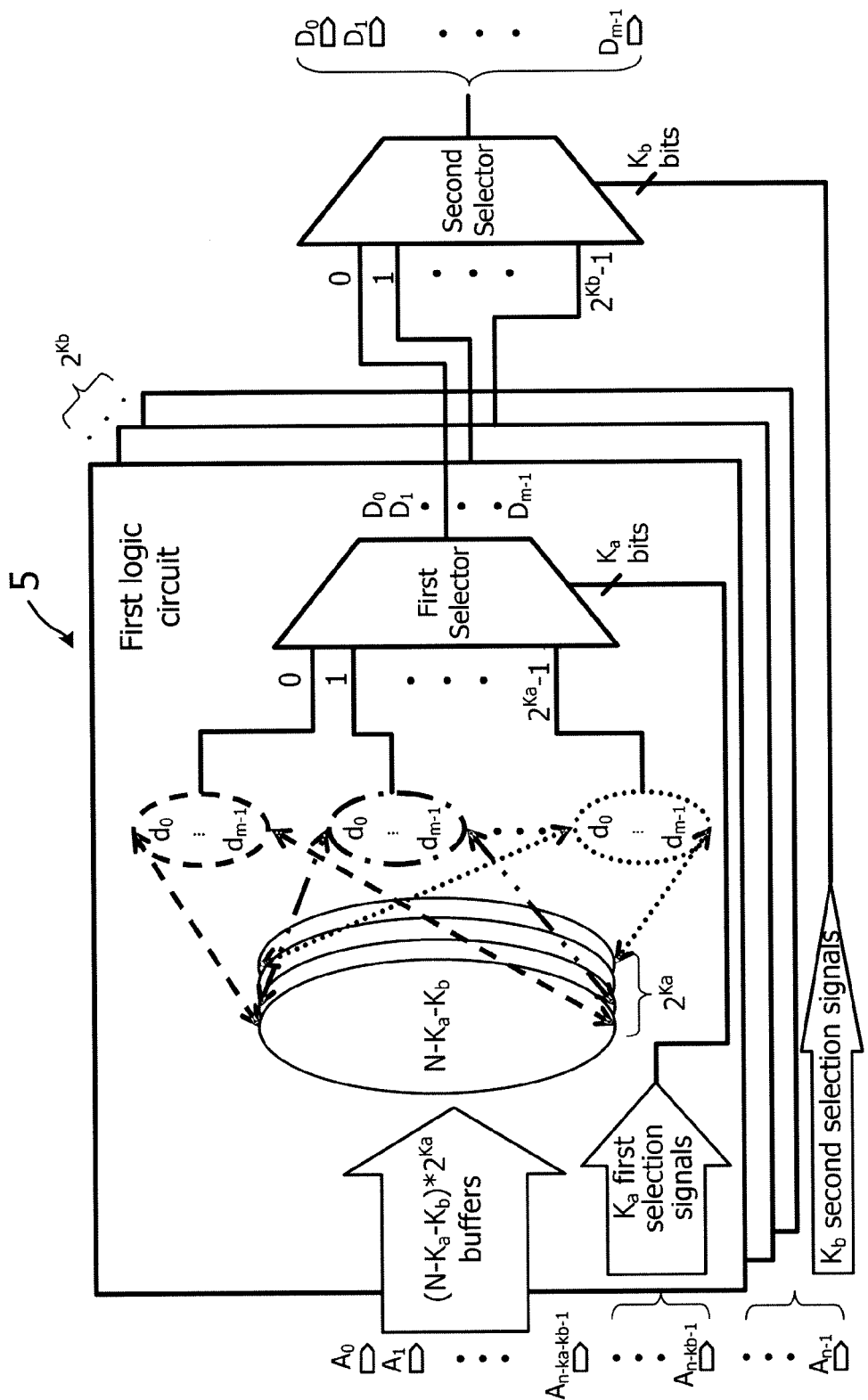
FIGS. 6 and 7 are schematic diagrams illustrating a two-order selection procedure using different approaches.
Figure 7:
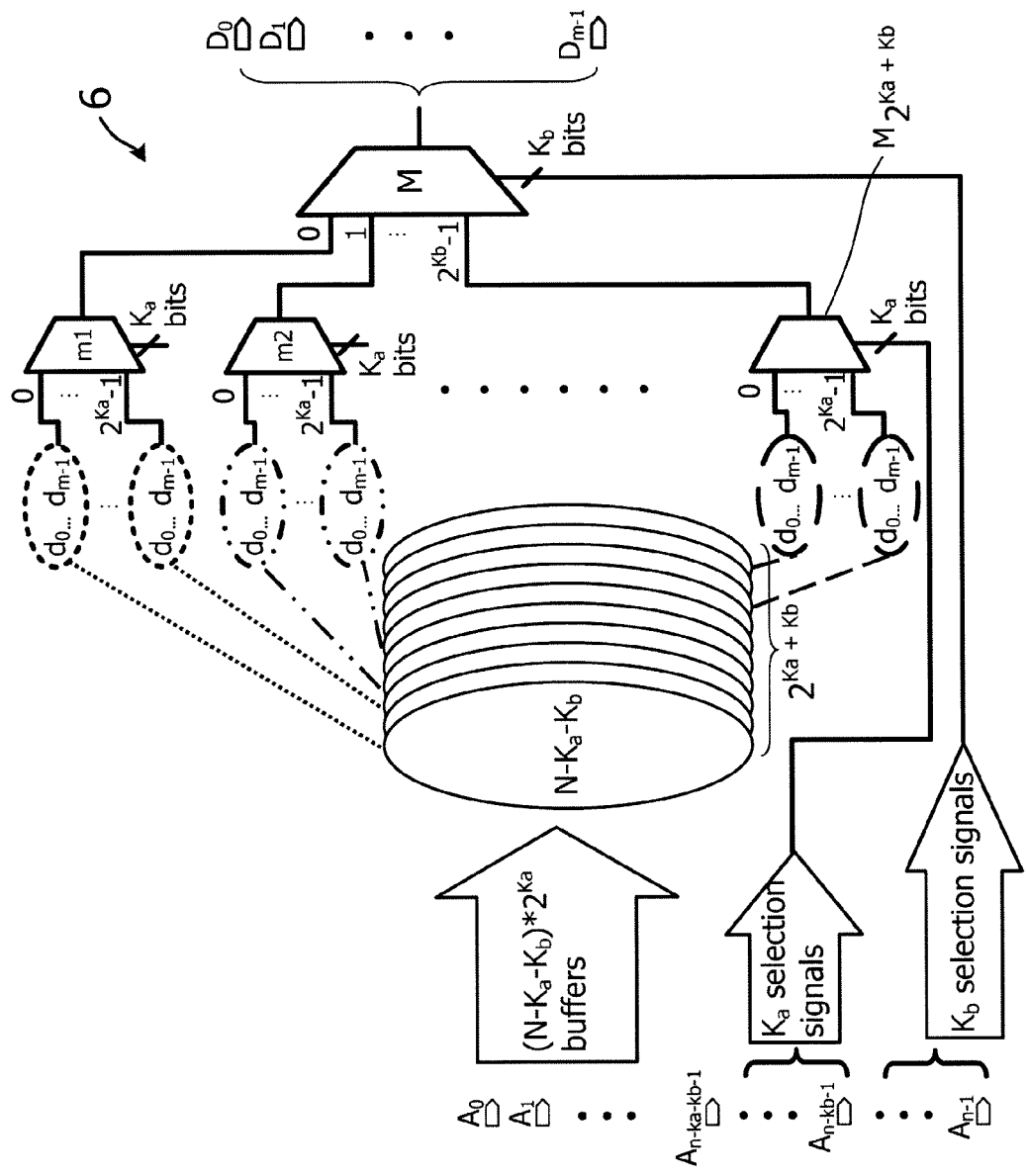

To solve the above issue, the invention further provides two-order selection approaches. FIGS. 6 and 7 are schematic diagrams illustrating a two-order selection procedure using different approaches—FIG. 6 shows the two-order selection using a hierarchical approach, and FIG. 7 shows the two-order selection using a flattened approach.

With reference to FIG. 6, a logic circuit layout 5 comprises N input ends, of which $(N-K_a-K_b)$ input ends serve as first input ends, and remaining $(K_a+K_b)$ input ends serve as second input ends, where N is a positive integer greater than 2, and $K_a$ and $K_b$ are positive integers. The logic circuit layout 5 further comprises $2^{Kb}$ logic circuits, each of which comprises $2^{Ka}$ sub logic circuits and a first selector.

Among the $(K_a+K_b)$ second input ends, the $K_a$ second input ends are coupled to a first selector of each logic circuit, and are for transmitting first selection signals to the first selectors; the $K_b$ second input ends are coupled to a second selector, and are for transmitting second selection signals to the second selector. More specifically, each first selector attends to the selection procedure of the $2^{Ka}$ sub logic circuits of each logic circuit, and the second selector attends to the selection procedure of the first selectors. Using such two-order approach, a total number of $(2^{Kb}+1)$ selectors are needed, and loading of each selector is smaller than that of the only one available selector in the previous embodiment to prevent overloading of the selectors to further increase an overall performance.

As shown in FIG. 7, a logic circuit layout 6 comprises N input ends, of which $(N-K_a-K_b)$ input ends serve as first input ends, and remaining $(K_a+K_b)$ input ends serve as second input ends, where N is a positive integer greater than 2, and $K_a$ and $K_b$ are positive integers. The logic circuit layout 6 further comprises $2^{Ka+Kb}$ logic circuits; every $2^{Ka}$ logic circuits of the $2^{Ka+Kb}$ logic circuits are coupled to a first selector among $2^{Kb}$ first selectors $m_1 \sim m_2^{Kb}$; that is, each first selector attends to the selection procedure of $2^{Ka}$ logic circuits, and the second selector attends to the selection procedure of the first selectors. Using such flattened approach, a total number of $(2^{Kb}+1)$ selectors are needed, and loading of each selector is smaller than that of the only one available selector in the previous embodiment to prevent overloading of the selectors to further increase an overall performance.

According to a second embodiment of the invention, a method of preventing congestive placement applied to a logic circuit layout is provided. In this embodiment, the logic circuit comprises N input ends, K second input ends, $2^K$ logic circuits, and M output ends; where M and N are integers greater than 1, and K is a positive integer. For example, the logic circuit layout may include a look-up table.

Figure 8:
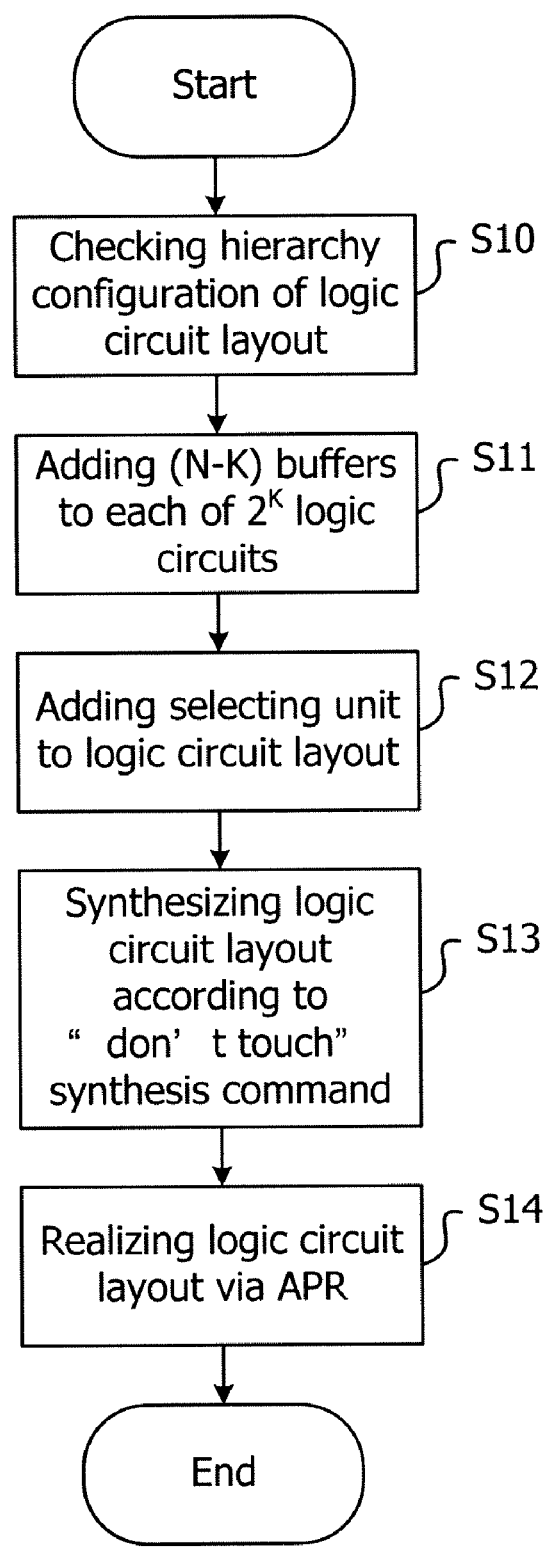
FIG. 8 is a flowchart of a method of preventing congestive placement according to a second embodiment of the invention.

FIG. 8 shows a flowchart of the method of preventing congestive placement. As shown in FIG. 8, the method begins with Step S10 to check a hierarchy configuration of the logic circuit layout. In Step S11, (N−K) buffers are added to each logic circuit of the $2^K$ logic circuits. In this embodiment, the (N−K) buffers access data according to access signals inputted at (N−K) first input ends among the N input ends to generate M data signals. A value of (N−K) is less or equal to 12, for example.

In Step S12, a selecting unit is added to the logic circuit layout. In practice, the selecting unit may be but not limited to a multiplexer. In this embodiment, the selecting unit selects a corresponding logic circuit from the $2^K$ logic circuits according to K selection signals inputted at the K second input ends among the N input ends, and outputs the M data signals to the M output ends.

In Step S13, the logic circuit layout is synthesized according to a plurality of "don't touch" synthesis commands associated with the added buffers. In practice, the logic circuit layout is synthesized from an RTL HDL to a gate level HDL in Step S13, for example. It is to be noted that in the synthesized logic circuit layout, each of the $2^K$ logic circuits is independent, and is not coupled to or merged with one another, or simplified; that is, no connections exist between the logic circuits. Step S14 is then performed to realize the synthesized logic circuit layout by automatic placement-and-routing (APR). Details of the method of preventing congestive placement are similar to the description of the foregoing first embodiment of the invention, and shall be omitted here for brevity.

With the embodiments of the present invention, according to the apparatus and method of preventing congestive placement, buffers and a selecting unit are added to an RTL HDL of a logic circuit layout to change an original logic circuit layout. Further, the logic circuit layout is synthesized according to a plurality of "don't touch" synthesis commands associated with the added buffers to ensure that each of the logic circuits in the circuit layout is kept independent without having any connections between one another.

Accordingly, in an APR result obtained after an APR procedure performed on the synthesized logic circuit layout, congestive regions where routing is infeasible are reduced. Therefore, according to the apparatus and method of preventing congestive placement, an issue of a logic circuit layout of a prior art that fails in passing design rule checking is effectively avoided.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A method of preventing congestive placement, applied to a logic circuit layout comprising N input ends, $2^K$ logic circuits and M output ends, M and N being positive integers greater than 1 and K being a positive integer, the method comprising:
   checking a hierarchy configuration of the logic circuit layout;
   adding (N−K) buffers to each of the $2^K$ logic circuits;
   adding a selection unit to the logic circuit layout; and
   using a computer, synthesizing the logic circuit layout according to a plurality of don't touch synthesis commands associated with the added buffers.

2. The method of preventing congestive placement as claimed in claim 1, wherein the (N−K) buffers access data according to access signals inputted at (N−K) input ends among the N input ends to generate M data signals.

3. The method of preventing congestive placement as claimed in claim 1, wherein the selecting unit selects a corresponding logic circuit from the $2^K$ logic circuits according to K selection signals inputted at the K second input ends among the N input ends, and outputs the M data signals to the M output ends.

4. The method of preventing congestive placement as claimed in claim 1, wherein the selecting unit is a multiplexer.

5. The method of preventing congestive placement as claimed in claim 1, wherein in the synthesized logic circuit layout, each of the $2^K$ logic circuits is kept independent, and are not coupled to or merged with one another, or simplified.

6. The method of preventing congestive placement as claimed in claim 1, further comprising:
realizing the synthesized logic circuit layout by implementing automatic placement-and-routing (APR).

7. The method of preventing congestive placement as claimed in claim 1, wherein a value of (N–K) is smaller than or equal to 12.

8. The method of preventing congestive placement as claimed in claim 1, wherein the synthesizing step synthesizes the logic circuit layout from an original register transfer level (RTL) hardware description language (HDL) to a gate level HDL.

9. The method of preventing congestive placement as claimed in claim 1, wherein the logic layout circuit further comprises a look-up table.

10. An apparatus for preventing congestive placement, applied to a logic circuit layout comprising (N–K) first input ends, K second input ends, $2^K$ logic circuits and M output ends, M and N being positive integers greater than 1 and K being a positive integer, the apparatus comprising:
a restructuring module, coupled to the logic circuit layout, for restructuring the logic circuit layout to a restructured logic circuit layout by adding a selecting unit to the logic circuit layout and (N–K) buffers to each of the $2^K$ logic circuits; wherein the selecting unit is coupled to the K second input ends, the $2^K$ logic circuits and the M output ends, and the (N–K) buffers are coupled to the (N–K) first input ends; and
a synthesizing module, coupled to the logic circuit layout, for synthesizing the restructure logic circuit layout according to a plurality of don't touch synthesis commands associated with the added buffers.

11. The apparatus for preventing congestive placement as claimed in claim 10, wherein the selecting unit is a multiplexer.

12. The apparatus for preventing congestive placement as claimed in claim 10, wherein each of the $2^K$ logic circuits is kept independent, and is not coupled to or merged with one another, or simplified.

13. The apparatus for preventing congestive placement as claimed in claim 10, further comprising:
an APR module, coupled to the logic circuit, for realizing the synthesized logic circuit layout by implementing APR.

14. The apparatus for preventing congestive placement as claimed in claim 10, wherein a value of (N–K) is smaller than or equal to 12.

15. The apparatus for preventing congestive placement as claimed in claim 10, wherein the synthesizing step synthesizes the logic circuit layout from an original RTL HDL to a gate level HDL.

16. The apparatus for preventing congestive placement as claimed in claim 10, wherein the logic layout circuit further comprises a look-up table.

17. The apparatus for preventing congestive placement as claimed in claim 10, wherein the logic circuit layout accesses data according to (N–K) access signals inputted at the (N–K) first input ends to generate M data signals.

18. The apparatus for preventing congestive placement as claimed in claim 17, wherein selecting unit selects a corresponding logic circuit from the $2^K$ logic circuits according to K selection signals inputted at the K second input ends among the N input ends, and outputs the M data signal to the M output ends.

19. The apparatus for preventing congestive placement as claimed in claim 10, further comprising:
a checking module, for checking a hierarchy configuration of the logic circuit layout.

20. The apparatus for preventing congestive placement as claimed in claim 10, wherein the selecting unit comprises:
a plurality of first selectors, coupled to the $2^K$ logic circuits, for receiving data signals inputted at the $2^K$ logic circuits, and
a second selector, coupled to the plurality of first selectors, the K second input ends and the M output ends, for selecting a corresponding logic circuit from the $2^K$ logic circuits according to K selection signals inputted at the K second input ends among the N input ends, and outputting the M data signals to the M output ends.

* * * * *